United States Patent
Staszczyk et al.

(10) Patent No.: US 10,941,583 B2
(45) Date of Patent: *Mar. 9, 2021

(54) SEISMIC YIELDING CONNECTION

(71) Applicant: PatCo, LLC, Arvada, CO (US)

(72) Inventors: Grzegorz Staszczyk, Cracow (PL);
John Louis Vanker, Denver, CO (US);
Michael J. Lastowski, Centennial, CO (US)

(73) Assignee: PatCo, LLC, Arvada, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/798,089

(22) Filed: Feb. 21, 2020

(65) Prior Publication Data

US 2020/0190840 A1 Jun. 18, 2020

Related U.S. Application Data

(63) Continuation of application No. 16/149,976, filed on Oct. 2, 2018, now Pat. No. 10,570,637.

(60) Provisional application No. 62/567,446, filed on Oct. 3, 2017.

(51) Int. Cl.
| | | |
|---|---|---|
| *E04H 9/02* | (2006.01) | |
| *E04B 1/08* | (2006.01) | |
| *E04B 1/24* | (2006.01) | |
| *G06F 30/13* | (2020.01) | |

(52) U.S. Cl.
CPC ............... *E04H 9/024* (2013.01); *E04B 1/08* (2013.01); *G06F 30/13* (2020.01); *E04B 1/24* (2013.01); *E04B 2001/246* (2013.01); *E04B 2001/2415* (2013.01); *E04B 2001/2418* (2013.01);
(Continued)

(58) Field of Classification Search
CPC . E04B 1/24; E04B 1/36; E04B 1/5812; E04B 1/5818; E04B 1/58; E04B 2001/1918; E04B 2001/2415; E04H 9/024; E04H 9/02; E04H 9/029
See application file for complete search history.

(56) References Cited

U.S. PATENT DOCUMENTS

| | | |
|---|---|---|
| 4,070,847 A | 1/1978 | Madl, Jr. |
| 4,910,929 A | 3/1990 | Scholl |
| 2002/0114659 A1 | 8/2002 | Binna et al. |

(Continued)

FOREIGN PATENT DOCUMENTS

| | | |
|---|---|---|
| FR | 2731022 A1 | 2/1995 |
| WO | 2009073914 A1 | 6/2009 |

OTHER PUBLICATIONS

PCT Search Report from corresponding PCT Application No. PCT/US2018/054008, dated Jan. 2, 2019.
(Continued)

*Primary Examiner* — Christine T Cajilig
(74) *Attorney, Agent, or Firm* — Holzer Patel Drennan

(57) ABSTRACT

The disclosed technology provides a seismic yielding connector. The seismic yielding connector includes a U-shaped plate configured to connect a side stud of a panel to another component of a panel and a yielding plate located between the U-shaped plate and the side stud of the panel. A high-strength bolt connects the U-shaped plate, the yielding plate, and the side stud of the panel to a structural column. A bushing is located between the U-shaped plate and the structural column.

18 Claims, 9 Drawing Sheets

(52) U.S. Cl.
CPC ............... *E04B 2001/2448* (2013.01); *E04B 2001/2454* (2013.01); *E04B 2001/2496* (2013.01)

(56) References Cited

U.S. PATENT DOCUMENTS

| | | |
|---|---|---|
| 2004/0200178 A1 | 10/2004 | Simmons |
| 2006/0185296 A1 | 8/2006 | Sasaki |
| 2011/0107699 A1 | 5/2011 | Kawei et al. |
| 2011/0179725 A1 | 7/2011 | Hiriyur et al. |
| 2013/0104467 A1 | 5/2013 | Yamao et al. |
| 2013/0211795 A1 | 8/2013 | Vanker et al. |
| 2015/0033641 A1 | 2/2015 | Satoh et al. |
| 2016/0115687 A1 | 4/2016 | Lanzilotta et al. |
| 2016/0215492 A1* | 7/2016 | Karns ................... E04H 9/024 |
| 2016/0244966 A1 | 8/2016 | Miyazawa et al. |
| 2016/0251845 A1 | 9/2016 | Evans et al. |

OTHER PUBLICATIONS

PCT Written Opinion from corresponding PCT Application No. PCT/US2018/054008, dated Jan. 2, 2019.

\* cited by examiner

SEISMIC YIELDING CONNECTION

CROSS-REFERENCE TO RELATED APPLICATIONS

The present application is a continuation application of U.S. Nonprovisional patent application Ser. No. 16/149,976 entitled "Seismic Yielding Connection," filed on Oct. 2, 2018, which is a Non-Provisional application based on and claims benefit of U.S. Provisional Patent Application Ser. No. 62/567,446 entitled "Seismic Yielding Connection," filed on Oct. 3, 2017, all of which are incorporated by reference herein for all that they disclose and teach.

BACKGROUND

Earthquakes may release sudden and significant forces on the structure of a building. Buildings in areas prone to earthquakes are often built to withstand the forces of an earthquake using shear panels and assemblies, structural tie-downs, and dampening systems. However, these solutions may require extensive structural augmentation and may be costly.

SUMMARY

The described technology addresses one or more of the foregoing problems by providing a seismic yielding connector. The seismic yielding connector includes a U-shaped plate configured to connect a side stud of a panel to another component of a panel and a yielding plate located between the U-shaped plate and the side stud of the panel. A high-strength bolt connects the U-shaped plate, the yielding plate, and the side stud of the panel to a structural column. A bushing is located between the U-shaped plate and the structural column.

BRIEF DESCRIPTION OF DRAWINGS

FIG. 8A illustrates a top view of an example seismic yielding connector implemented on an I beam. FIG. 8B illustrates a front view of an example seismic yielding connector implemented on an I beam.

DETAILED DESCRIPTION

Figure 1:
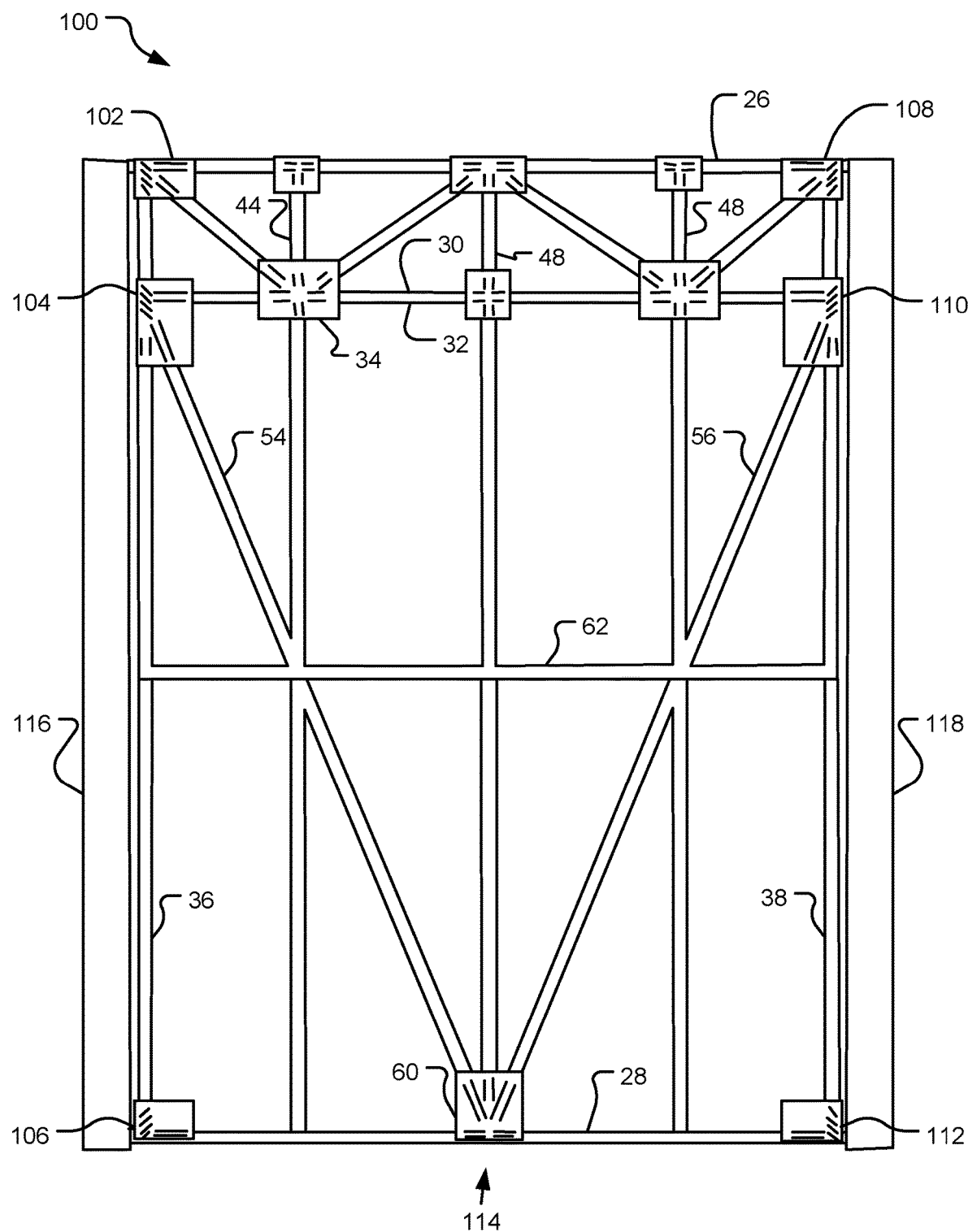
FIG. 1 illustrates an example of a seismic yielding panel with seismic yielding connectors connecting a panel to structural columns.

FIG. 1 illustrates an example seismic yielding panel 100 with seismic yielding connectors 102, 104, 106, 108, 110, and 112 connecting a panel 114 to structural columns 116 and 118. The seismic yielding panel 100 may be used in conjunction with other seismic yielding panels in construction of a cold-formed steel building. For example, the panel 114 may be prefabricated and assembled at a construction site. The seismic yielding panel 100 may be used in areas where earthquakes are more likely to ensure that buildings can withstand seismic forces. Though the panel 114 is shown as a V-braced horizontal truss panel, other types of panels with other configurations and structural assemblies, such as moment frames, may be augmented with the seismic yielding connection.

During construction of a building the panel 114 is attached to the structural columns 116 and 118 using the seismic yielding connectors. The structural columns 116 and 118 may be hollow structural section (HSS) columns and may have a variety of cross-sectional shapes, including, without limitation square or rectangular cross-sections. The structural columns 116 and 118 each include openings (not shown) for receiving a high-strength bolt as part of the seismic yielding connector. Depending on the location of the structural columns 116 and 118, each of the structural columns 116 and 118 may be connected to one or more than one panel. For example, a structural column located at a corner of a building may be connected to two panels, while a structural column located along an outside wall of a building at a point where an interior wall meets the outside wall may be connected to three panels.

The seismic yielding connectors 102, 104, 106, 108, 110, and 112 make connections between the panel 114 and the structural columns 116 and 118 that are stiff enough to mobilize the inherent stiffness of the panel 114, which helps control damage during small earthquake ground motions. Bushings in the seismic yielding connectors 102, 104, 106, 108, 110, and 112 allow the seismic yielding connectors to plastically deform during a seismic event, dissipating the energy in the system as a whole. Accordingly, the panel 114, the seismic yielding connectors 102, 104, 106, 108, 110, and 112, and the structural columns 116 and 118 are less likely to be damaged during a seismic event.

As shown in FIG. 1, the panel 114 is a V-braced horizontal truss panel with a top track 26 and a bottom track 28. Inboard of the top track 26 is a continuous horizontal brace comprised of back-to-back (web-to-web) tracks 30 and 32, (referred to as double horizontal bracing), which are anchored by the seismic yielding connector 104 to side stud 36 and by the seismic yielding connector 110 to side stud 38 at the sides of the panel 114. The area between the continuous horizontal brace formed by the tracks 30 and 32 and the top track 26 contains vertical angled webbing made from studs. This braced area supports and transfers vertical and lateral forces exerted on the panel 114 to the columns 116 and 118 attached to each of the side studs 36 and 38 of the V-braced horizontal truss panel.

The panel 114 also has two inboard studs 44 and 46 and a center stud 48 anchored by fastening plates 34 to the top and bottom tracks 26 and 28 and to the tracks 30 and 32. The side studs 36 and 38 pass through end cutouts in the ends of the web 14 and in the lips 18 of the tracks 30 and 32 such that the flanges 16 of the studs 36 and 38 abut the flanges 16 at the ends of the tracks 26, 28, 34, and 36. The fastening plates 34 are at these abutment areas. Similarly, the inboard studs 44 and 46 and the center stud 48 pass through interior cutouts of the webs and lips of the tracks 30 and 32 such that an exterior of the flanges of the studs 36 and 38 and of the center stud abut the interior of the flanges of the tracks 26, 28, 36, and 38. The fastening plates 34 are at these abutment areas. The five vertical studs 36, 38, 44, 46, and 48, for example, may be spaced 24" on center. The point at which the inboard studs 44 and 46 and the center stud 48 pass through the tracks 30 and 32 is a hinge connection (i.e., a single fastener allows for rotation). The studs of the panel 114 also serve to support drywall, conduit, wiring, plumbing assemblies, etc.

The panel 114 also contains a continuous V-shaped bracing. This V-Bracing is unique in its design and engineering. The two legs of the V-brace are V-brace studs 54 and 56. The V-brace stud 54 is anchored to the side stud 36 just below the tracks 30 and 32 by the seismic yielding connector 104 and to the bottom track 28 by an apex plate 60 and passes through an interior cutout in the web of the inboard stud 44. The web of the V-brace stud 54 abuts one flange of each of the studs 36 and 44 and the track 28.

Similarly, the V-brace stud 56 is anchored to the side stud 38 just below the tracks 30 and 32 by the seismic yielding connector 110 and to the bottom track 28 by apex plate 60 and passes through the interior cutout in the inboard stud 46. The web of the V-brace stud 56 abuts one flange of each of the studs 38 and 46 and the track 28.

The V-brace studs 54 and 56 are positioned with their webs parallel to the webs of the studs 36, 44, 48, 46, and 38 of the panel 114. Also, the V-brace studs 54 and 56 run continuously from immediately below the tracks 30 and 32 through the inboard studs 44 and 46 to the apex of a "V" at substantially the middle of the bottom track 28. The connection at the apex of the V-bracing is facilitated by an apex plate 60 and structural welds, which interconnect the V-brace studs 54 and 56 and the center stud 48. The plate 60, the bottom track 28, and the stud 48 and the V-brace studs 54 and 56 are interconnected by welds. The inboard stud 46 is also attached by fastening plates 34 and welds to the top track 26 and to the tracks 30 and 32 at the point where the inboard stud 46 passes through the interior cutouts 52 in the tracks 30 and 32. The apex plate 60 may be formed from a material such as 18-14 gauge cold roll steel.

The connections of the V-brace studs 54 and 56, to the side studs 36 and 38, to the center stud 48, and to the track 28 are moment connections and improve the lateral structural performance of the panel 114. These connections facilitate the transfer of most of the lateral forces acting on the panel 114 to the structural columns 116 and 118 of the seismic yielding panel 100.

The panel 114 also contains a track 62 providing horizontal bracing. The track 62 is located, for example, midway in the V-Brace formed by the V-brace studs 54 and 56. The track 62 has the end cutouts to accommodate the inboard studs 44 and 46, has the interior cutout 52 to accommodate the center stud 48, and is anchored by fasteners to the inboard studs 44 and 46 and to the center stud 48. The track 62 contributes to the lateral-force structural performance of the panel 114.

Figure 2:
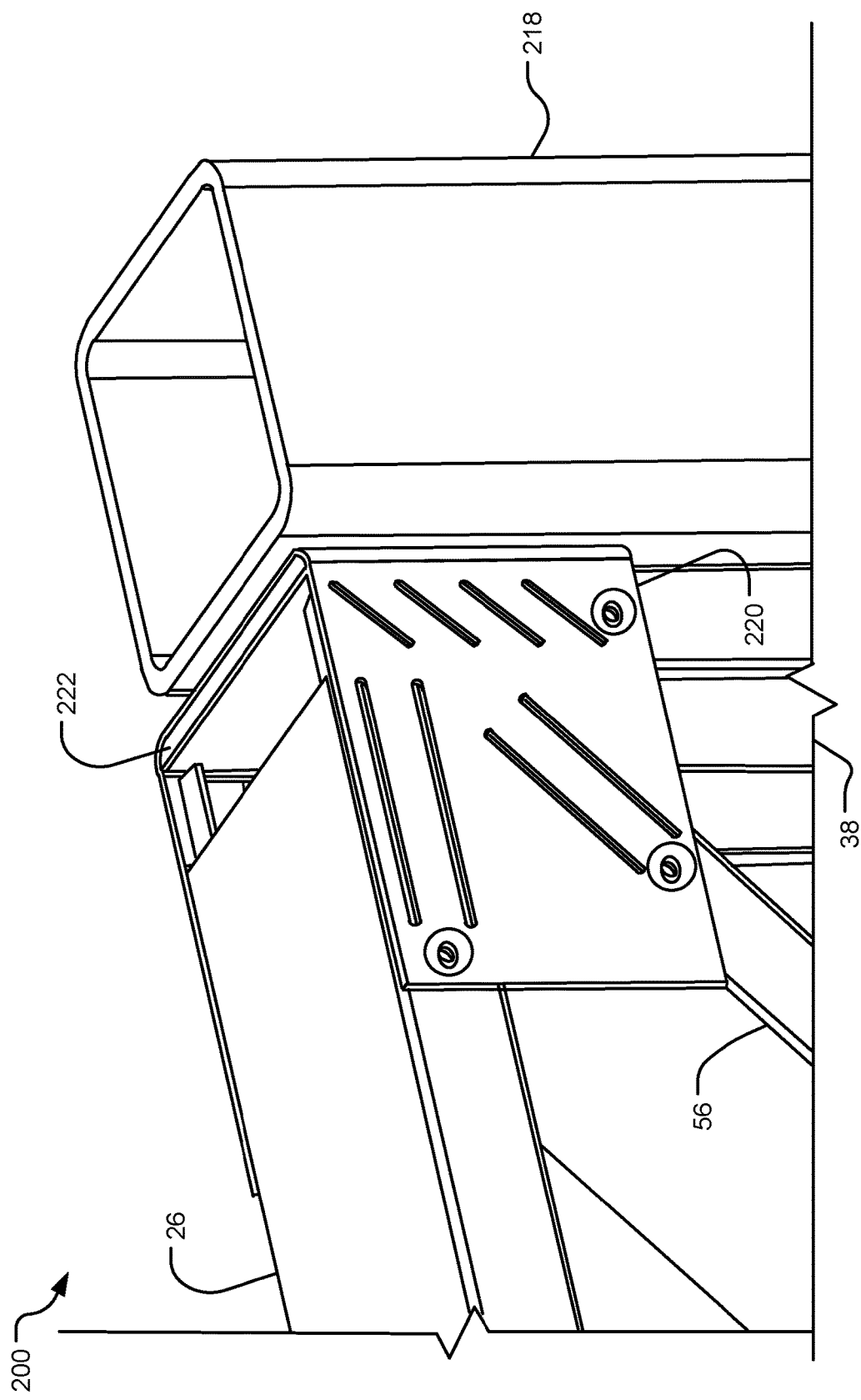
FIG. 2 illustrates a perspective view of an example seismic yielding connector connecting a panel to a structural column.

FIG. 2 illustrates a perspective view of an example seismic yielding connector connecting a panel to a structural column 218. The seismic yielding connector includes a U-shaped plate 220, a yielding plate 222, a high strength bolt (not shown), and an outer bushing (not shown). The seismic yielding connector is shown connecting the right side of a panel to a column 218. The corner of the panel is formed by a track 26, a truss configuration area webbing 56, and a side stud 38, all welded to the U-shaped plate 220.

The U-shaped plate 220 is connected to the side stud 38 in a way that creates a pocket formed by the U-shaped plate 220 and the outer surface of the side stud 38. This pocket provides a space for the yielding plate 222. The yielding plate 222 is configured to plastically deform during a seismic event. In some implementations, the thickness of the yielding plate 222 may depend on where the yielding plate 222 is located within a larger structure. For example, in a building with multiple stories, a yielding plate located on a higher story may have a smaller thickness, because more displacement is tolerable at a higher story during a seismic event.

The U-shaped plate 220 may be welded to each of the track 26, the truss configuration area webbing 56, and the side stud 38 using welding slots located on the U-shaped plate 220. To simplify construction, the U-shaped plate 220 may be fastened to the panel initially using rivets in each of the side stud 38, the truss configuration area webbing 56, and the track 26. The rivets help to hold the components in place for simpler, more accurate welding. The U-shaped plate 220, yielding plate 222, and the side stud 38 are connected to the column 218 by a high strength bolt, bushings, and washers (not shown in FIG. 2 and discussed further below).

The U-shaped plate 220 may be manufactured from cold-formed steel. The size, shape, and configuration of welding slots on the U-shaped plate 220 will change depending on where on a panel the U-shaped plate 220 is located. For example, referring to FIG. 1, the U-shaped plate that is part of the seismic yielding connector 110 is larger than the U-shaped plate that is part of the seismic yielding connector 108 to accommodate for the angle of the truss configuration area webbing 56. Similarly, the U-shaped plates that are part of the seismic yielding connector 106 and 112 have fewer welding slots than other U-shaped plates because they join side studs 36 and 38, respectively, to the bottom track 28.

Figure 3:
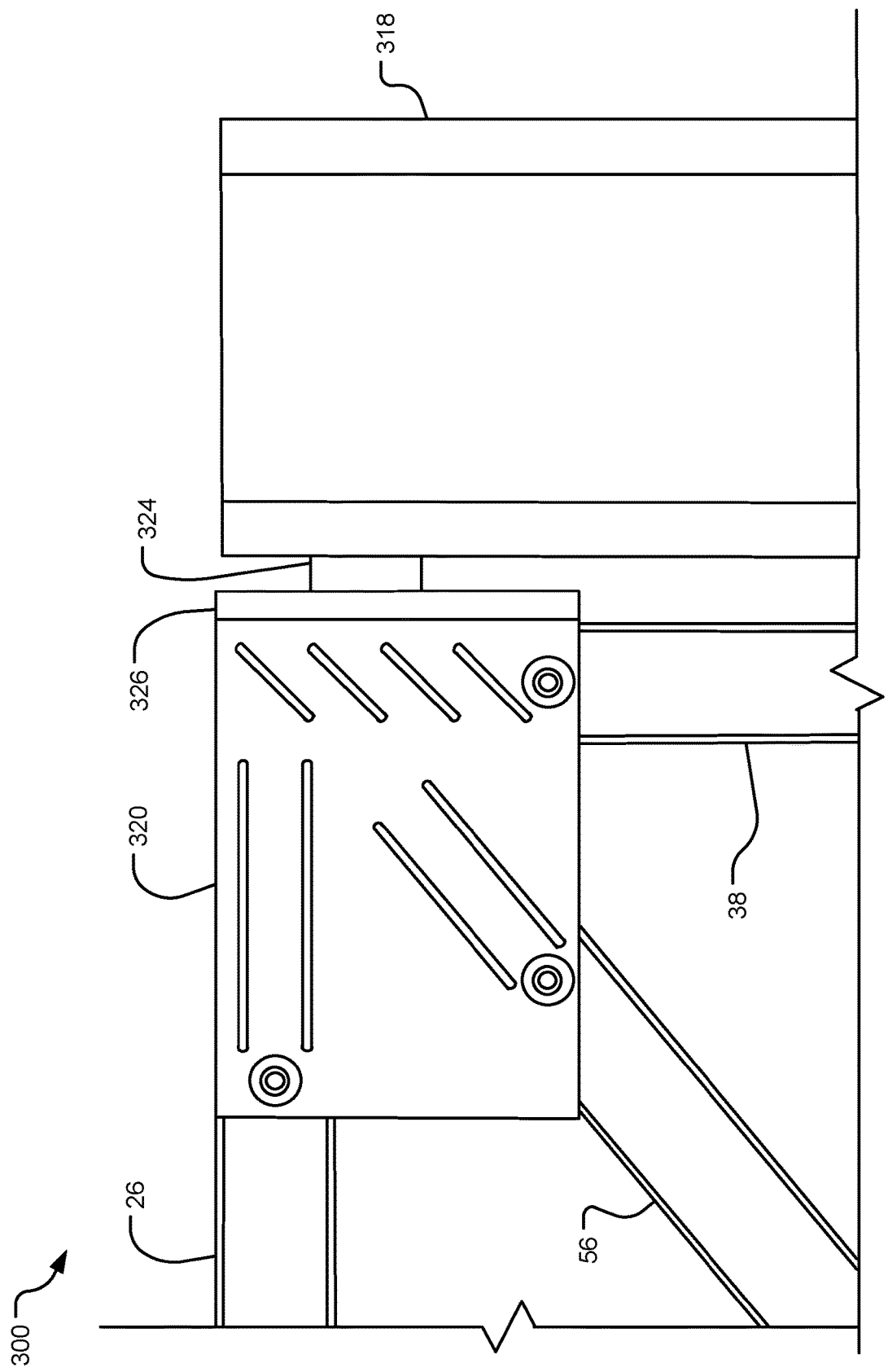
FIG. 3 illustrates an example seismic yielding connector connecting a panel to a structural column.

FIG. 3 illustrates an example seismic yielding connector connecting a panel to a structural column. The seismic yielding connector is shown connecting the right side of a panel to a column 318. The U-shaped plate 320 wraps around a side stud 38 of the panel. Additionally, the U-shaped plate 320 serves as the connection between the side stud 38, a track 26, and a truss configuration area webbing 56 of the panel. The U-shaped plate 320 is attached to the side stud 38 such that a pocket 326 is created by the U-shaped plate 320 and the side stud 38. The pocket 326 is where a yielding plate (not shown) is placed.

An outer bushing 324 is located between the column 318 and the right face of the U-shaped plate 320. When seismic forces are exerted on the seismic yielding connector, the U-shaped plate 320 and the yielding plate deform around the outer bushing 324. The outer bushing 324 creates space for the U-shaped plate 320 and the yielding plate to deform without coming into contact with the column 318. Additionally, the round shape of the outer bushing 324 allows for easy quality control in the field.

In some implementations, the outer diameter of the outer bushing 324 may depend on where the outer bushing 324 is located within a larger structure. For example, when the outer bushing 324 is located on a higher floor in a multi-story building, the outer diameter may be smaller, to allow for more deformation of the U-shaped plate 320 and the yielding plate.

Figure 4:
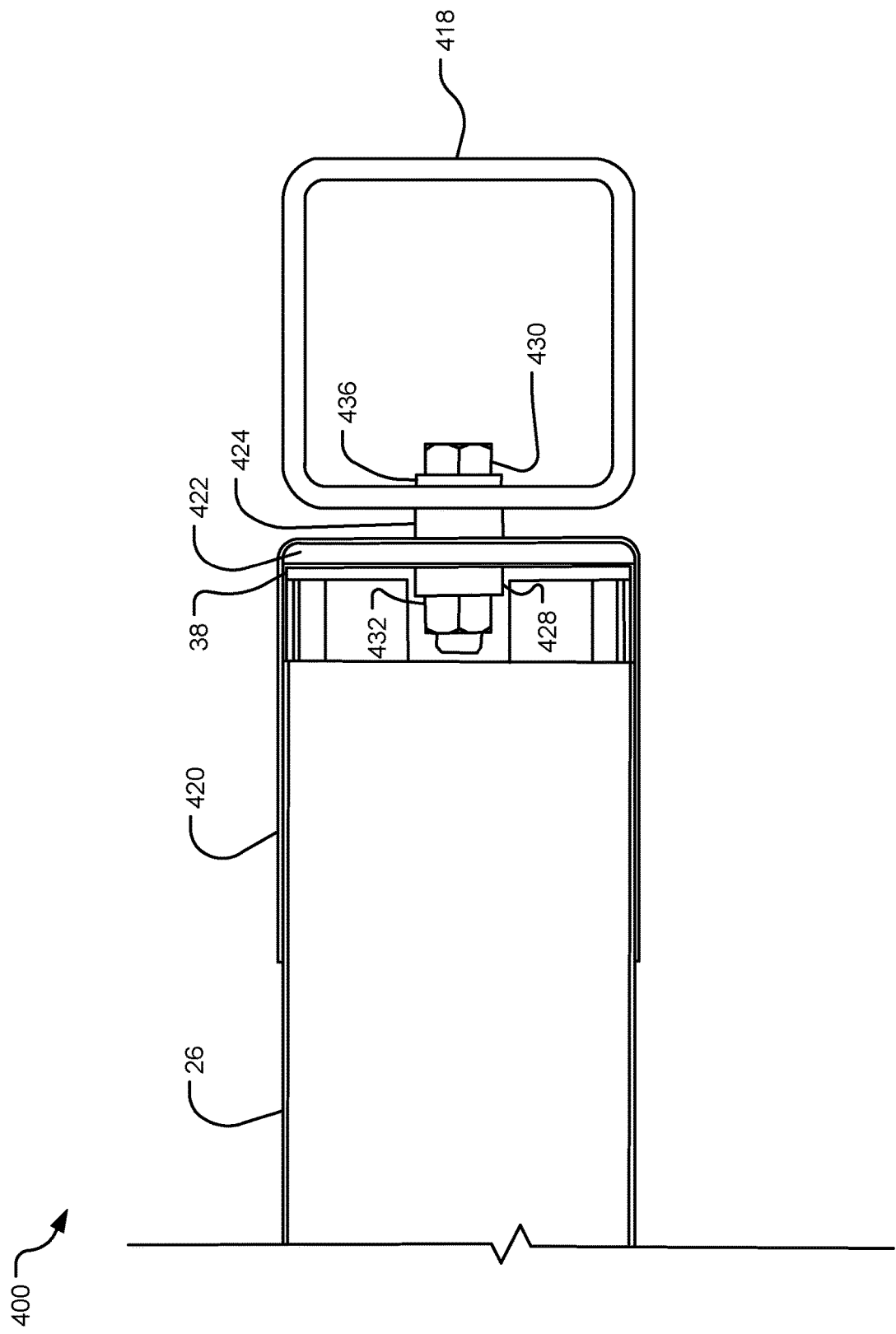
FIG. 4 illustrates a top view of an example seismic yielding connector connecting a panel to a structural column.

FIG. 4 illustrates a top view of an example seismic yielding connector connecting a panel to a structural column. A U-shaped plate 420 is attached to a track 26 of a panel. The U-shaped plate 420 is attached in a way that creates a pocket for a yielding plate 422. To attach the track 26 and side stud 38 to a column 418, a high strength bolt 430 is inserted through a side stud 38, the yielding plate 422, the U-shaped plate 420, and the column 418. A washer 436 may be included between the head of the high strength bolt 430 and the column 418. An outer bushing 424 provides spacing between the U-shaped plate 420 and the column 418. In some implementations, an inner bushing 428 is located between the side stud 38 and a nut 432. The nut 432 secures the high strength bolt 430. In some implementations, the inner bushing 428 may be threaded, eliminating the need for the nut 432.

In other implementations, the high strength bolt 430 goes from the side stud 38 through the yielding plate 422, the outer bushing 424, and the column 418. The end of the high strength bolt 430 may be secured inside the column 418 using a variety of securing mechanisms, including, without limitation, a nut, washer, threaded bushing, or threaded plate.

The yielding plate 422 is made from ductile steel. The front edges of the yielding plate 422 may be rounded to fit into the U-shaped plate 420 and to avoid stress concentrations when the yielding plate 422 deforms when seismic loads are placed on the seismic yielding connector. The yielding plate 422 may be a variety of thicknesses, and different thicknesses of yielding plates 422 may be more desirable in different parts of a building. For example, because the thickness of the yielding plate 422 controls the displacement of the U-shaped plate 422, a thicker yielding plate 422 may be used in a seismic yielding connector that is installed on the lower floor of a tall building, where less displacement is tolerable during seismic events. Conversely, a yielding plate 422 with a smaller thickness may be used in a seismic yielding connector that is installed on the upper floor of a tall building, where more displacement is tolerable during a seismic event.

When seismic forces are applied to the seismic yielding connector, the yielding plate 422 and the U-shaped plate 420 deform around the outer bushing 424. Like the variety of thicknesses possible for the yielding plate 422, the outer bushing 424 may be a variety of diameters depending on where in the building the seismic yielding connector is located. The assortment of yielding plate 422 thicknesses and outer bushing 424 diameters provides a useful range of design capacities.

The seismic yielding connector creates a ductile connection, providing a large displacement capacity, which is necessary to meet the building code criterion for collapse prevention in the maximum considered earthquake ground motions (MCE ground motions). The seismic yielding connector continues to gain strength following yield of the steel through strain hardening of the material and geometric stiffening at large displacements. This strength gain is very helpful for collapse prevention in the MCE ground motions. The configuration of the seismic yielding connector also provides a simple method for computation of the yield design mechanism. The seismic yielding connector is designed to be weak enough to avoid premature failure of important cold-formed steel elements in the load path. The strength and ductility of the seismic yielding connector also provides resistance to progressive collapse of a structure given the loss of a steel column.

Figure 5:
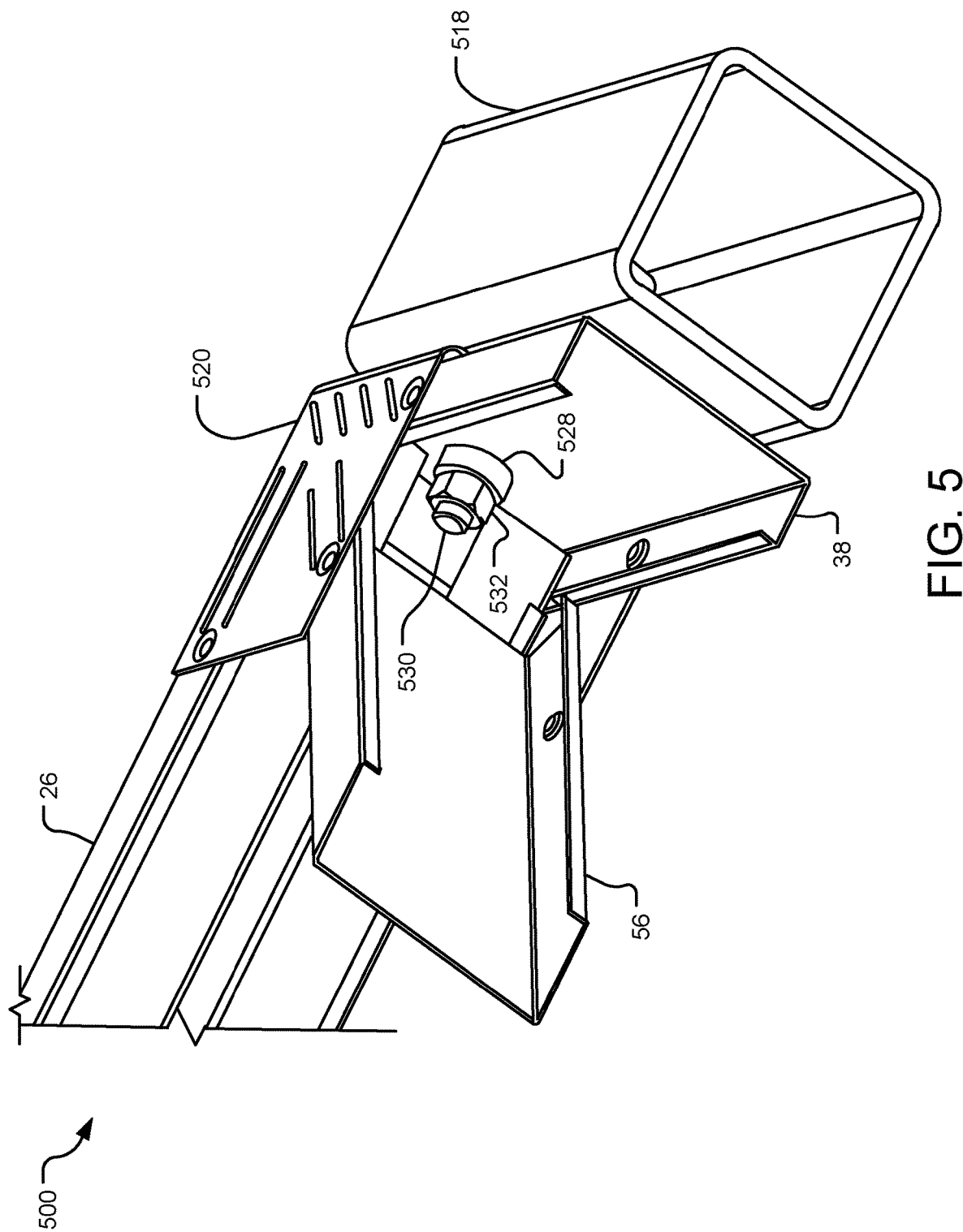
FIG. 5 illustrates a perspective view of an example seismic yielding connector connecting a panel to a structural column.

FIG. 5 illustrates a perspective view of an example seismic yielding connector connecting a panel to a structural column. The seismic yielding connector connects a track 26, a truss configuration area webbing 56, and a side stud 38 to a column 518. The seismic yielding connector includes a U-shaped plate 520, a yielding plate (not shown), and a high strength bolt 530. The U-shaped plate 520 is attached to the track 26, the truss configuration area webbing 56, and the side stud 38. In one implementation, the track 26, the truss configuration area webbing 56, and the side stud 38 may be welded to the U-shaped plate 520 using welding slots located on the U-shaped plate 520. The U-shaped plate 520 may also have holes for rivets. The rivets may hold the U-shaped plate 520 in place with respect to the track 26, the truss configuration area webbing 56, and the side stud 38 during the welding process. The U-shaped plate 520 is attached to the side stud 38 so that a pocket is created by the U-shaped plate 520 and the side stud 38. The yielding plate is located within the pocket created by the U-shaped plate 520 and the side stud 38.

The column 518 is attached to the seismic yielding connector with a high strength bolt 530. The high strength bolt 530 goes through the side stud 38, the yielding plate, the U-shaped plate 520, an outer bushing (not shown), and the column 518. An inner bushing 528 and a nut 532 may be used to secure the high strength bolt 830 inside the side stud 38. In some implementations, the inner bushing 528 is threaded, so an additional nut 532 is not needed to secure the inner bushing 528. A washer may be placed between the head of the high strength bolt 530 and the column 518.

In other implementations, the high strength bolt 530 goes from the side stud 38 through the yielding plate 522, the outer bushing 524, and the column 518. The end of the high strength bolt 530 may be secured inside the column 518 using a nut, washer, threaded bushing, or threaded plate.

Figure 6:
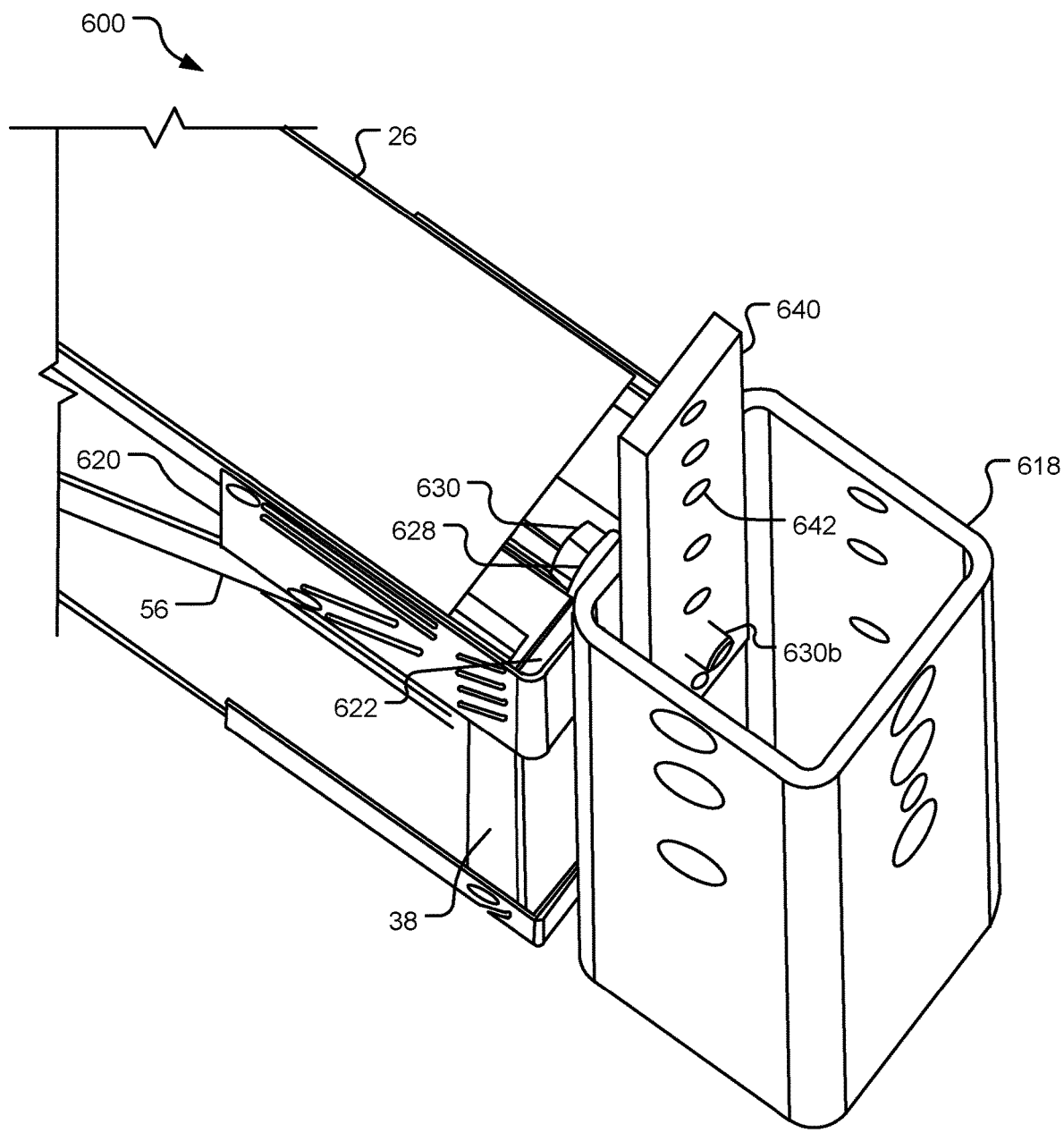
FIG. 6 illustrates a perspective view of an example seismic yielding connector connecting a panel to a structural column, where threaded connector plates are used inside the structural column.

FIG. 6 illustrates a perspective view of an example seismic yielding connector connecting a panel to a structural column 618, where a threaded connector plate 640 is used inside the structural column 618. The seismic yielding connector connects a track 26, a truss configuration area webbing 56, and a side stud 38 to the structural column 618. The seismic yielding connector includes a U-shaped plate 620, a yielding plate 622, a high strength bolt 630, and an outer bushing (not shown). The U-shaped plate 620 is attached to the track 26, the truss configuration area webbing 56, and the side stud 32. In one implementation, the track 26, the truss configuration area webbing 56, and the side stud 32 are all welded to the U-shaped plate 620 using welding slots located on the U-shaped plate 620. The U-shaped plate 620 may also have holes for rivets. The rivets may hold the U-shaped plate 620 in place with respect to the track 26, the truss configuration area webbing 56, and the side stud 38 during the welding process. The U-shaped plate 620 is attached to the side stud 32 so that a pocket is created by the U-shaped plate 620 and the side stud 38. The yielding plate 622 is located within the pocket created by the U-shaped plate 620 and the side stud 38.

The structural column 618 is attached to the seismic yielding connector with the high strength bolt 630. The high strength bolt 630 goes through an inner bushing 628, the side stud 38, the yielding plate 622, the U-shaped plate 620, an outer bushing (not shown), and the structural column 618. The threaded connector plate 640 is located inside the column 618. The threaded connector plate 640 secures the high-strength bolt 630 inside the column 618 using threaded holes (e.g., a threaded hole 642). As shown, the threaded end 630*b* of the high-strength bolt 630 is secured by the threaded plate 640.

Figure 7:
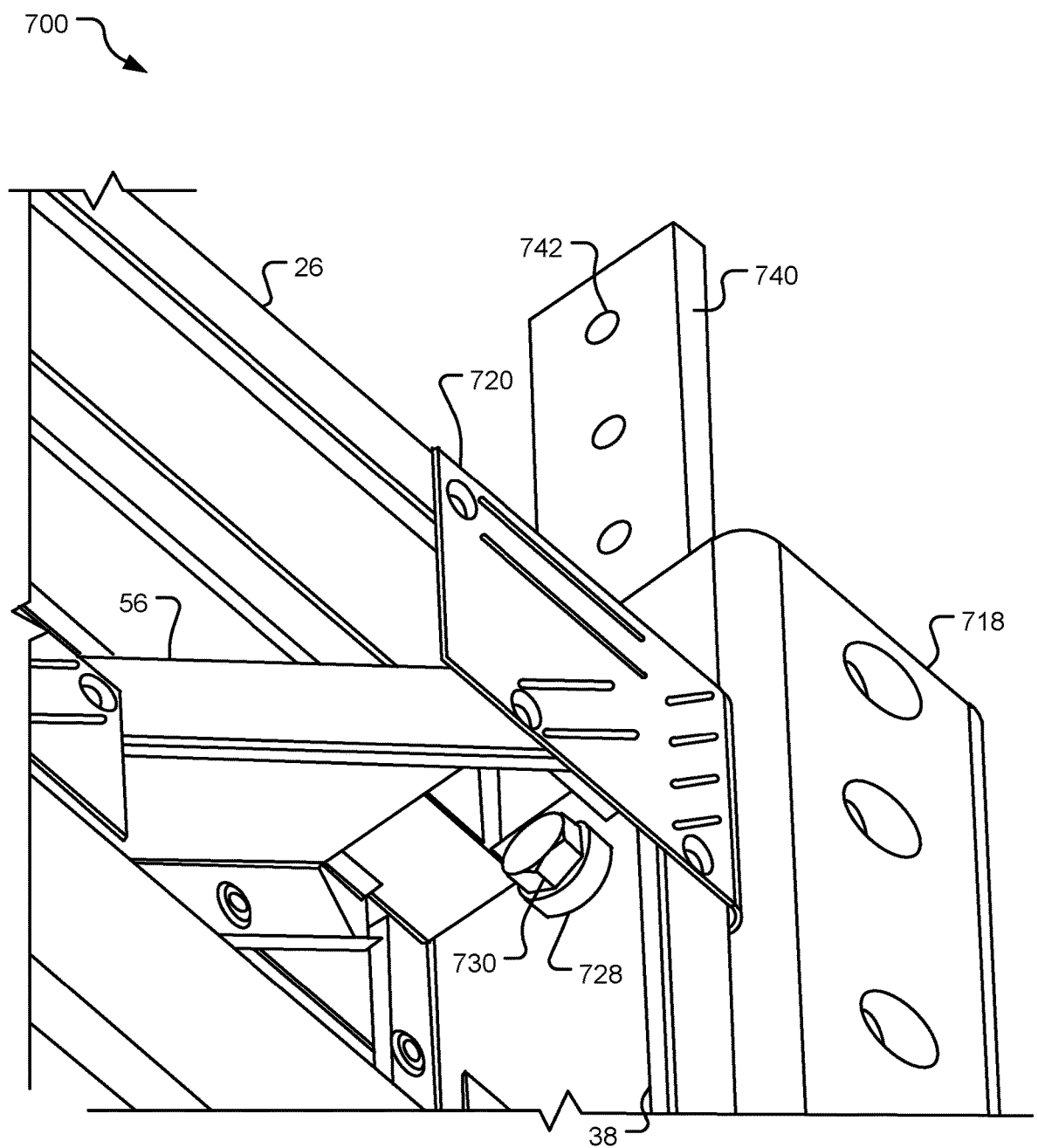
FIG. 7 illustrates a perspective view of an example seismic yielding connector connecting a panel to a structural column, where threaded connector plates are used inside the structural column.

FIG. 7 illustrates a perspective view of an example seismic yielding connector connecting a panel to a structural column 718, where a threaded connector plate 740 is used inside the structural column 718. The seismic yielding connector connects a track 26, a truss configuration area webbing 56, and a side stud 38 to a column 718. The seismic yielding connector includes a U-shaped plate 720, a yielding plate (not shown), and a high strength bolt 730. The U-shaped plate 720 is attached to the track 26, the truss configuration area webbing 56, and the side stud 38. In one implementation, the track 26, the truss configuration area webbing 56, and the side stud 38 are all welded to the U-shaped plate 720 using welding slots located on the U-shaped plate 720. The U-shaped plate 720 may also have holes for rivets. The rivets may hold the U-shaped plate 720 in place with respect to the track 26, the truss configuration area webbing 56, and the side stud 38 during the welding process. The U-shaped plate 720 is attached to the side stud 38 so that a pocket is created by the U-shaped plate 720 and the side stud 38. The yielding plate is located within the pocket created by the U-shaped plate 720 and the side stud 38.

The structural column 718 is attached to the seismic yielding connector with a high strength bolt 730. The high strength bolt 730 goes through an inner bushing 728, the side stud 38, the yielding plate, the U-shaped plate 720, an outer bushing (not shown), and the structural column 718. The threaded connector plate 740 is located inside the structural column 718. The threaded connector plate 740 secures the high strength bolt 730 inside the structural column 718 through threaded holes (e.g., a threaded hole 742).

Figure 8A:
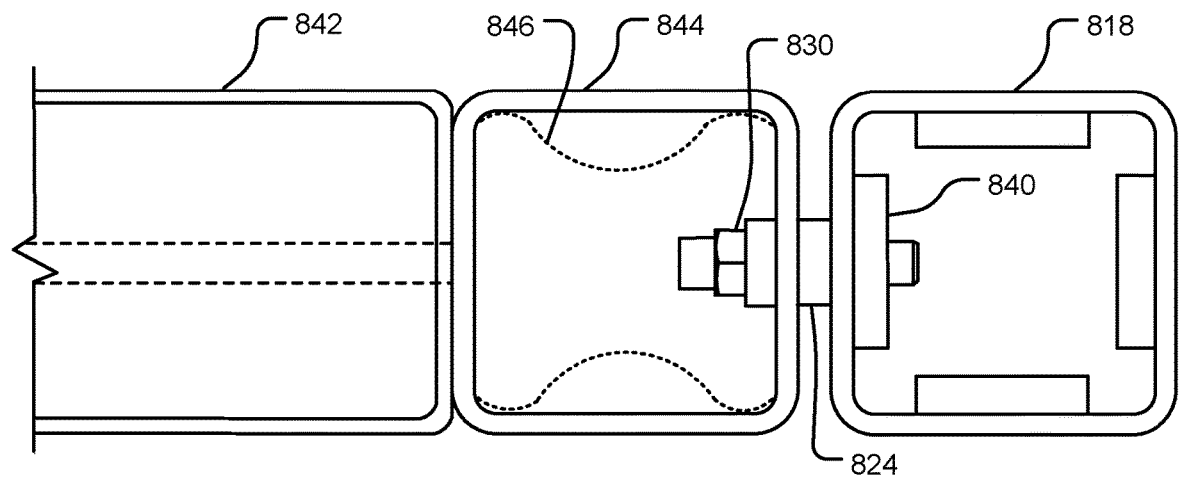
FIGS. 8A and 8B illustrate example seismic yielding connectors implemented on I beams.
Figure 8B:
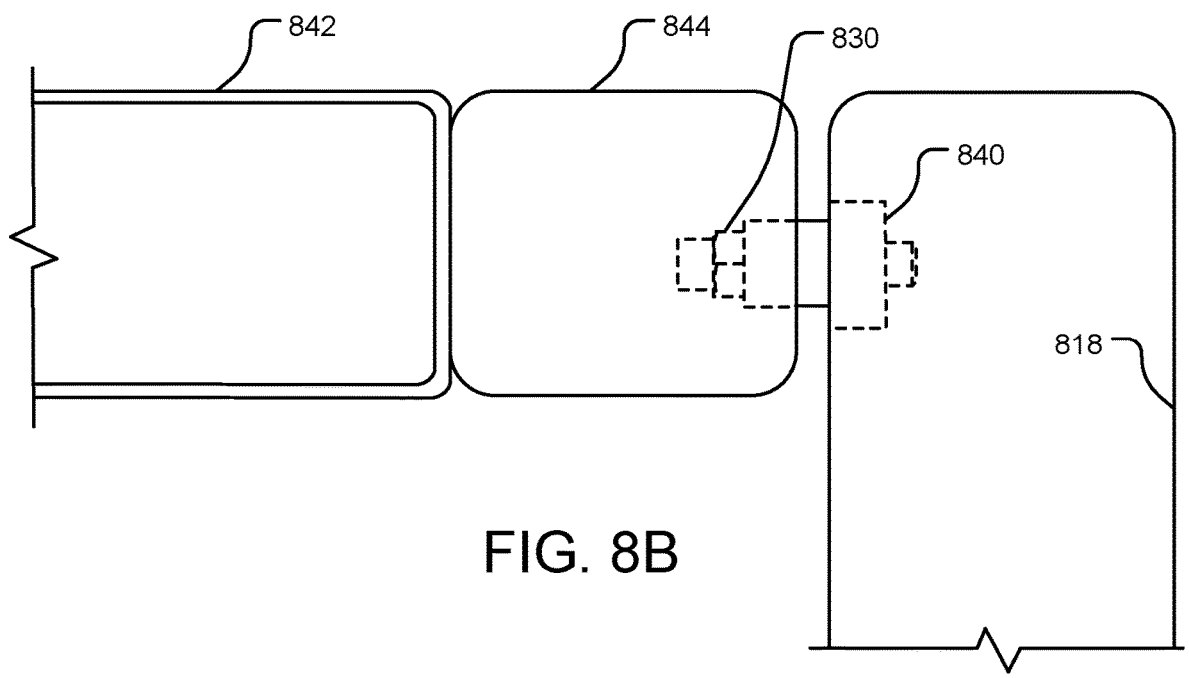

FIGS. 8A and 8B illustrate example seismic yielding connectors implemented on I beams. FIG. 8A illustrates a top view of an example seismic yielding connector implemented on an I beam. FIG. 8B illustrates a front view of an example seismic yielding connector implemented on an I beam. In this implementation, the seismic yielding connector consists of a yielding tube 844, a high strength bolt 830, a bushing 824, and a threaded connector plate 840. The yielding tube 844 is connected to the I beam 842. In one implementation, the yielding tube 844 is welded to the I beam 842. The yielding tube 844 is then connected to a column 818 using a high strength bolt 830. The high strength bolt 830 goes through the yielding tube 844, a bushing 824, and the column 818. In one implementation, the high strength bolt 830 is secured using a threaded connector plate 840. In other implementations, the high strength bolt 830 may be secured using any combination of a nut, washer, and bushing. A broken line 846 shows how the yielding tube 844 may deform when the seismic yielding connector is subjected to seismic forces.

Figure 9:
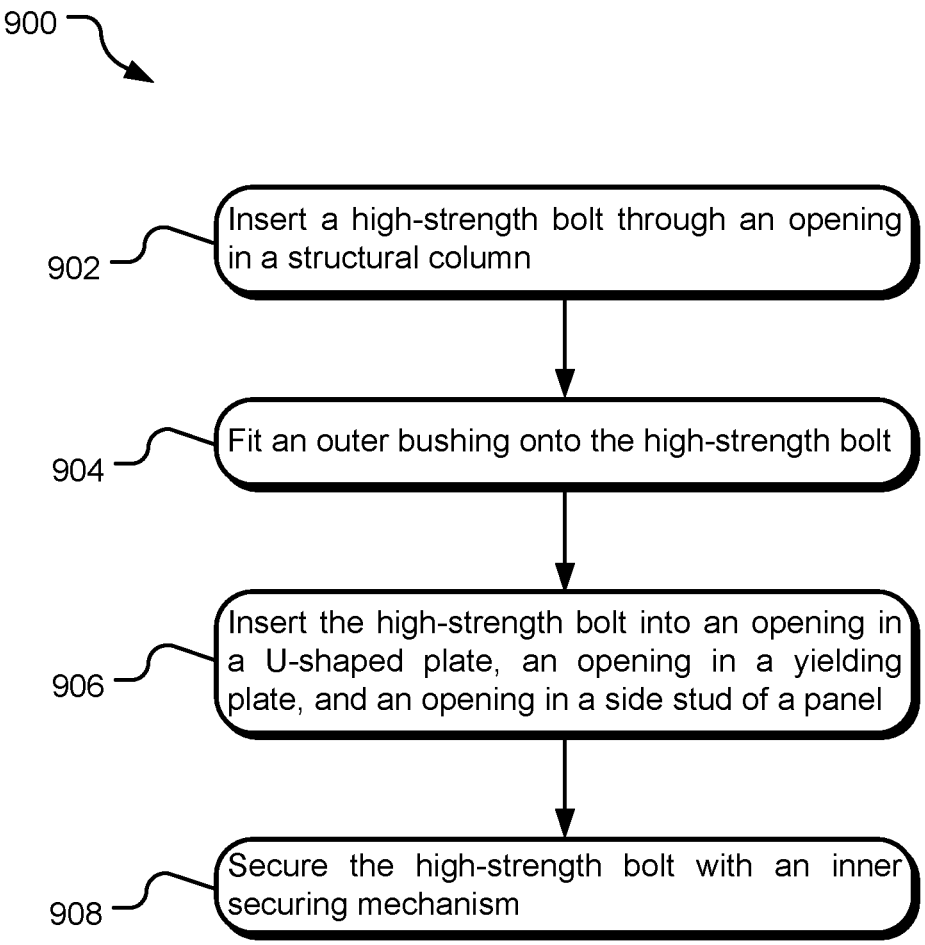
FIG. 9 illustrates example operations for assembling a seismic yielding connector to connect a panel to a structural column.

FIG. 9 illustrates example operations for assembling a seismic yielding connector to connect a panel to a structural column. The seismic yielding connector includes a U-shaped plate, a yielding plate, a high-strength bolt, and a bushing. A first inserting operation 902 inserts a high-strength bolt through an opening in a structural column. In some implementations, the structural column may have openings cut to accommodate the height of the seismic yielding connectors with a specific type of panel. In other implementations, regular openings may be spaced along the structural column to allow for flexibility.

A fitting operation 904 fits an outer bushing onto the high-strength bolt. The outer bushing is ultimately located outside the structural column and between the structural column and a U-shaped plate. The outer bushing provides spacing between the structural column and the U-shaped plate, allowing the U-shaped plate to deform around the outer bushing when seismic forces are present. The outer diameter of the outer bushing may vary to control the deformation of the U-shaped plate. For example, an outer bushing with a bigger outer diameter will allow for less deformation of the U-shaped plate than an outer bushing with a smaller outer diameter.

A second inserting operation 906 inserts the high-strength bolt into an opening in the U-shaped plate, an opening in a yielding plate, and an opening in a side stud of a panel. The second inserting operation 906 creates the seismic yielding connector. The U-shaped plate is attached to the side stud of the panel (such as by welding) in a way that leaves a pocket for the yielding plate between the inside surface of the U-shaped plate and the outer surface of the side stud of the panel. The U-shaped plate may also act as a connector between the side stud of the panel and other components of the panel.

A securing operation 908 secures the high-strength bolt with an inner securing mechanism. In some implementations, the inner securing mechanism is an inner bushing. When the inner bushing acts as the inner securing mechanism, the inner bushing is threaded to secure the high-strength bolt in place as part of the seismic yielding connector. In other implementations, a non-threaded inner bushing may be placed on the high-strength bolt before another inner securing mechanism, such as a nut, is placed on the high-strength bolt to secure the high-strength bolt in the seismic yielding connector.

The above specification, examples, and data provide a complete description of the structure and use of exemplary implementations of the invention. Since many implementations of the invention can be made without departing from the spirit and scope of the invention, the invention resides in the claims hereinafter appended. Furthermore, structural features of the different implementations may be combined in yet another implementation without departing from the recited claims. While embodiments and applications of this invention have been shown, and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A seismic yielding connector comprising:
   a U-shaped plate configured to connect a side stud of a panel to another component of the panel;
   a yielding plate located between the U-shaped plate and the side stud of the panel;
   a high-strength bolt connecting the U-shaped plate, the yielding plate, and the side stud of the panel to a structural column; and
   a bushing located between the U-shaped plate and the structural column.

2. The seismic yielding connector of claim 1, wherein an outer diameter of the bushing is dependent on the location of the seismic yielding connector within a larger structure.

3. The seismic yielding connector of claim 1, further comprising:
   an inner bushing located on an inner face of the side stud.

4. The seismic yielding connector of claim 3, wherein the inner bushing is a threaded bushing.

5. The seismic yielding connector of claim 1, wherein the yielding plate has rounded edges on at least one face.

6. A seismic yielding panel, the seismic yielding panel comprising:
- a panel including an upper truss structure and one or more side studs; and
- one or more seismic yielding connectors connecting the one or more side studs of the panel to one or more structural columns, each of the one or more seismic yielding connectors comprising:
  - a U-shaped plate configured to connect one of the one or more side studs to another component of the panel;
  - a yielding plate located between the U-shaped plate and the one of the one or more side studs of the panel;
  - a high-strength bolt connecting the U-shaped plate, the yielding plate, and the one of the one or more side studs of the panel; and
  - a bushing, located between the U-shaped plate and one of the one or more structural columns.

7. The seismic yielding panel of claim 6, wherein the panel is a moment frame assembly.

8. The seismic yielding panel of claim 6, wherein a thickness of the yielding plate is dependent on the location of the seismic yielding connector within a larger structure.

9. The seismic yielding panel of claim 6, wherein an outer diameter of the bushing is dependent on the location of the seismic yielding connector within a larger structure.

10. The seismic yielding panel of claim 6, wherein at least one of the seismic yielding connectors further includes an inner bushing located on an inner face of the side stud.

11. The seismic yielding panel of claim 10, wherein the inner bushing is a threaded bushing.

12. The seismic yielding panel of claim 6, wherein the yielding plate has rounded edges on at least one face.

13. A method for connecting a seismic yielding panel to a structural column using a seismic yielding connector, the method comprising:
- inserting a high-strength bolt through an opening in a structural column;
- inserting the high-strength bolt into an opening in a U-shaped plate, an opening in a yielding plate, and an opening in a side stud of a panel; and
- securing the high-strength bolt with an inner securing mechanism.

14. The method of claim 13, wherein the inner securing mechanism is a threaded bushing.

15. The method of claim 13, wherein a thickness of the yielding plate is dependent on a location of the seismic yielding connector within a larger structure.

16. The method of claim 13, further comprising fitting an outer bushing onto the high-strength bolt, an outer diameter of the outer bushing being dependent on a location of the seismic yielding connector within a larger structure.

17. The method of claim 13, wherein the yielding plate has rounded edges on at least one face.

18. The method of claim 13, wherein the high-strength bolt is a threaded bolt.

* * * * *